US007605589B2

(12) United States Patent
Weiger et al.

(10) Patent No.: US 7,605,589 B2
(45) **Date of Patent: *Oct. 20, 2009**

(54) METHOD FOR AUTOMATIC SHIMMING FOR NUCLEAR MAGNETIC RESONANCE SPECTROSCOPY

(75) Inventors: Markus Weiger, Wettswil (CH); Michael Fey, Hornussen (CH); Thomas Speck, Thalwil (CH)

(73) Assignee: Bruker BioSpin AG, Faellanden (CH)

( * ) Notice: Subject to any disclaimer, the term of this patent is extended or adjusted under 35 U.S.C. 154(b) by 0 days.

This patent is subject to a terminal disclaimer.

(21) Appl. No.: 11/975,207

(22) Filed: Oct. 18, 2007

(65) Prior Publication Data

US 2008/0116894 A1 May 22, 2008

Related U.S. Application Data

(63) Continuation of application No. 11/279,149, filed on Apr. 10, 2006, now Pat. No. 7,348,775.

(51) Int. Cl.
*G01V 3/00* (2006.01)

(52) U.S. Cl. ...................................... 324/320; 324/319

(58) Field of Classification Search ................. 324/307, 324/320, 319
See application file for complete search history.

(56) References Cited

U.S. PATENT DOCUMENTS 5,539,316 A * 7/1996 Sukumar .................... 324/320
7,348,775 B2 * 3/2008 Weiger et al. ............... 324/307
2005/0248348 A1 * 11/2005 Axel .......................... 324/320

* cited by examiner

*Primary Examiner*—Louis M Arana
(74) *Attorney, Agent, or Firm*—Walter A. Hackler

(57) ABSTRACT

A method for homogenizing a static magnetic field with a magnetic field distribution B0(r) for nuclear magnetic resonance spectroscopy by adjusting the currents $C_i$ through the shim coils, thus creating spatial field distributions $C_i \cdot S_i(r)$, where r stands for one, two, or three of the spatial dimensions x, y, and z, and said magnetic field distribution B0(r) has only a field component along z, in a working volume of a magnetic resonance apparatus with one or more radio frequency (=RF) coils (5) for inducing RF pulses and receiving RF signals within a working volume, said RF coils having a spatial sensitivity distribution of magnitudes $B\mathbf{1}_k(r)$, and with shim coils (6) for homogenizing the magnetic field within the working volume, said shim coils (6) being characterized by their magnetic field distributions per unit current $S_i(r)$ and having components only along z, includes the following steps:

(a) Mapping the magnetic field distribution B0(r) of the main magnetic field, (b) calculating a simulated spectrum $I_S(f)$ based on the sum of the magnetic field distribution B0(r) and the additional field distributions $C_i \cdot S_i(r)$ generated by the shim coils (6), and on the sensitivity distributions $B\mathbf{1}_k(r)$ of the RF coils(5), (c) optimising a quality criterion derived from the simulated spectrum $I_S(f)$ by using an optimisation procedure within a search range with the shim currents $C_i$ as a set of parameters, whereby for each new set of parameter values step (b) has to be repeated, (d) realising the found optimum of the quality criterion of step (c) by generating the associated target field distribution $B\mathbf{0}_T(r)$.

In this way a direct one-to-one link is obtained between a set of shim currents and the associated NMR spectrum The quality of the desired NMR spectra can be improved with this method.

12 Claims, 7 Drawing Sheets

METHOD FOR AUTOMATIC SHIMMING FOR NUCLEAR MAGNETIC RESONANCE SPECTROSCOPY

The present application is a continuation of U.S. Ser. No. 11/279,149 filed Apr. 10, 2006 now U.S. Pat. No. 7,348,775. This application is to be incorporated herewith in its entirety by this specific reference thereto.

BACKGROUND OF THE INVENTION

The invention relates to a method for homogenizing a static magnetic field with a magnetic field distribution B0(r) for nuclear magnetic resonance spectroscopy by adjusting the currents $C_i$ through the shim coils, thus creating spatial field distributions $C_i \cdot S_i(r)$, where r stands for one, two, or three of the spatial dimensions x, y, and z, and said magnetic field distribution B0(r) has only a field component along z, in a working volume of a magnetic resonance apparatus with one or more radio frequency (=RF) coils for inducing RF pulses and receiving RF signals within a working volume, said RF coils having a spatial sensitivity distribution of magnitudes $B\mathbf{1}_k(r)$, and with shim coils for homogenizing the magnetic field within the working volume, said shim coils being characterized by their magnetic field distributions per unit current $S_i(r)$ and having components only along z.

Methods for homogenizing a magnetic field in the above mentioned manner are known from [1]-[4]

For NMR spectroscopy a very good homogeneity of the static magnetic field distribution B0(r) is required. Said B0(r) is often described as the local deviations from a spatially constant magnetic field value, which can e.g. be the average field over the working volume. In order to compensate for remaining inhomogeneities of the magnet and for field distortions due to other equipment (e.g. the probe head) and the sample, a set off shim coils is used to create an additional magnetic field. The magnetic field distributions per unit current $S_i(r)$ of said shim coils are called the “shim functions”. The procedure of shimming means finding the optimal choice of currents through the shim coils leading to optimal field homogeneity.

Each shimming procedure requires:

(i) a quality criterion for judging the homogeneity of the magnetic field and (ii) an algorithm for modifying the shim currents in order to find the optimum of the criterion.

Search Methods

Conventional shimming methods are based on a parameter search and work in an iterative way: An NMR measurement is performed, the value of the criterion is determined and evaluated, and the currents are modified accordingly. This procedure is repeated until the criterion fulfils a given absolute and/or relative condition for aborting the process.

(i) The chosen quality criterion is usually based on some kind of NMR measurement. It can be the lock level (i.e. the maximum value of the absorption lock signal) or some value determined from the time domain signal (FID) or from the frequency domain signal (spectrum) of a simple NMR experiment. In any case a more or less time-consuming NMR measurement is involved in each iteration. As a disadvantage of this kind of criterion, usually only a single aspect (e.g. width or height) of the resulting spectral line is considered. Therefore other important properties (e.g. smoothness or symmetry) are not taken into account.

(ii) There are many approaches for manually driven or computerised search algorithms for modifying the shim currents. In any case the problem is to find an optimum of the quality criterion with a limited number of iterations. However, often only local minima are obtained. Furthermore, many iterations may be necessary, so that shimming requires a considerable amount of time compared with the actual NMR experiment of interest. Generally speaking, the search methods suffer from not using any prior knowledge about the effect of the shim coils on the chosen criterion.

The Projection Approach

In order to overcome the last restriction mentioned, Dunkel [1] proposed that the effect of a shim coil can be described by a histogram, i.e. a projection, of the shim function onto the magnetic field axis. After measuring an NMR spectrum and removal of the natural lines by deconvolution the obtained shape represents the effect of the current inhomogeneity on the lines in a spectrum. A fit procedure with the shim function projections can be performed to this shape to obtain coefficients for the shim currents that compensate the distortions of the lines.

However, as the projection operation mathematically is not a one-to-one transformation, the resulting current values are not unambiguous and may therefore be wrong. Furthermore, the fit procedure is often badly conditioned.

Gradient Shimming

The gradient shimming method (e.g. [2], [3], [4]) is different from the search methods in that it directly considers the spatial influence of the shim coils. With search methods the criteria are derived from the NMR signal which is integrated over the whole sample volume. In contrast to that, with gradient shimming the spatial magnetic field distribution B0(r) is mapped, with r representing up to three spatial dimensions. To this end, phase-sensitive NMR imaging is performed by means of magnetic field gradients. The shim function of each shim coil that is the magnetic field distribution per unit current $S_i(r)$ of the shim coils is also mapped while a certain current is applied to this coil. Based on the knowledge collected about the field distribution and the shim functions a set of shim currents $C_i$ can be found that fulfils a given condition for minimising the remaining inhomogeneity.

In principle, it should be possible to find the required set of shim currents in a single step that involves mapping the field distribution only once. However, measurement inaccuracies favour multiple iterations similar to the search methods. In particular, when starting from a strongly inhomogeneous magnetic field, the quality of the measured data improves considerably after a few steps. However, as opposed to the search methods no optimisation algorithm is applied from iteration to iteration but the new currents are chosen “optimally” at each iteration according to the given mathematical instruction used for minimisation. Hence, the motivation for performing multiple iterations is different.

In the described conventional gradient shimming method the two aspects, criterion and algorithm, constitute the mathematical instruction:

(i) As a criterion very often a sum-of-squares of B0(r) over the region of interest is used, sometimes with some kind of spatial weighting.

(ii) This choice enables the use of a least-squares (LSQ) algorithm corresponding to a matrix inversion for direct calculation of the shim currents. Other criteria may require more complicated algorithms. Furthermore, constraints to the currents can be taken into account. Generally speaking, with gradient shimming the new shim values are chosen by means of an optimisation procedure that in the case of the LSQ criterion can be performed by direct calculation.

The main disadvantages of the described approach arise from the fact that a perfect solution corresponding to complete homogeneity is usually not possible, i.e. the residual field distribution $B\mathbf{0}_R(r)$ is not constant. This means that many different solutions are possible for the "optimum" shim values depending on the chosen local weighting of spatial regions. The different solutions lead to different residual inhomogeneity with a corresponding spectral line shape. As there is no direct link between spatial inhomogeneity and spectral line shape, the described criteria derived in space do not ensure the quality of the result-of-interest, which is the NMR spectrum.

In connection with the approach of iteratively improving the result a further problem is raised. As the residual field cannot be brought to zero at all locations, the optimisation algorithm aims at an impossible result during each iteration. This leads to a limited convergence of the iterative shimming procedure due to differences in the errors of the field mapping results at successive iterations.

SUMMARY OF THE INVENTION

Object of the invention is to suggest a method that bridges the gap between the spatial effect of the shim functions and the quality of the desired NMR spectrum.

This object is achieved by a method including the following steps:

(a) mapping the magnetic field distribution $B\mathbf{0}(r)$ of the main magnetic field, (b) calculating a simulated spectrum $I_S(f)$ based on the sum of the magnetic field distribution $B\mathbf{0}(r)$ and the additional field distributions $C_i \cdot S_i(r)$ generated by the shim coils, and on the sensitivity distributions $B\mathbf{1}_k(r)$ of the RF coils, (c) optimising a quality criterion derived from the simulated spectrum $I_S(f)$ by using an optimisation procedure within a search range with the shim currents $C_i$ as a set of parameters, whereby for each new set of parameter values step (b) has to be repeated, (d) realising the found optimum of the quality criterion of step (c) by generating the associated target field distribution $B\mathbf{0}_T(r)$.

The result expected from a good NMR measurement is a clean NMR spectrum not hampered by field inhomogeneity. Therefore, in order to judge a certain shim setting it would be best to acquire and analyse the data of interest each time after changing the currents as done with conventional search methods. However, on the one hand this procedure would be far too time-consuming in most cases. On the other hand, the spectrum obtained from any but a very simple sample would be very difficult to analyse in an automatic manner.

Instead, with the inventive method an NMR spectrum can be simulated from the available spatially resolved field data and by deriving one or several quality criteria from this spectrum. In this way a direct one-to-one link is obtained between a set of shim currents and the associated NMR spectrum.

The optimum of said quality criteria can usually not be found by direct calculation but by application of a suitable optimisation algorithm. The entire procedure is equivalent to the conventional search methods used for shimming but it does not involve any measurements. On the other hand, it replaces the mathematical instruction (e.g. least-squares algorithm) in the conventional gradient shimming procedure. After the optimum solution is obtained, the associated residual field distribution $B\mathbf{0}_R(r)$ is used as the target field $B\mathbf{0}_T(r)$.

The mapping of the magnetic field distribution $B\mathbf{0}(r)$ in step (a) of the inventive method is preferably carried out with phase sensitive NMR imaging using gradients.

The simulation process of the spectrum comprises preferably:

(i) choice of a "virtual" NMR sample substance and a "virtual" experiment, (ii) incorporation of hardware properties of RF coils and/or or gradient coils, used in the planned NMR experiment, in particular of the sensitivity distributions $B\mathbf{1}_k(r)$ of the RF coils, into the calculation, (iii) incorporation of the actual sample volume into the calculation The NMR spectrum can be simulated by assuming a certain, preferably simple compound in a "virtual" sample (e.g. "free protons") and by calculating the spectrum obtained by a "virtual" experiment. In many cases the standard NMR experiment would be chosen, that is, an excitation pulse followed by the acquisition of the FID.

In principle, the choice of sample and experiment is entirely free as long as they reflect the influence of $B\mathbf{0}(r)$ on the properties of interest of the planned NMR experiment. Selecting them as simple as possible enables a faster calculation of the spectrum which will also be easier to evaluate in terms of the quality criteria used for shimming. However, there are NMR experiments that favour more sophisticated simulations due to a more complicated influence of $B\mathbf{0}(r)$, such as e.g. solvent suppression techniques, multi-dimensional spectroscopy, decoupling, or multiple-quantum filtering.

For the calculation of the standard NMR spectrum two main properties of the system to be simulated must be known. One is the spatial magnetic field distribution $B\mathbf{0}(r)$ over the extent of sample as obtained by field mapping. In order to simulate a certain shim setting, the resulting weighted combination of the shim functions is then added to the field map. The second property is the spatial distribution of the sensitivity $B\mathbf{1}_k(r)$ of the radio-frequency (RF) coil used for excitation and signal reception in the planned NMR experiment. Note, that this $B\mathbf{1}$ sensitivity distribution may be identical with that of the coil used for the mapping but that it can also be different. $B\mathbf{1}_k(r)$ enters the calculation by weighting the contribution of a location to the final spectrum in various ways. It can be obtained e.g. by either NMR or other kinds of measurements.

For the simulation of more complicated experiments other system properties are also required, such as e.g. the $B\mathbf{1}$ sensitivity distribution field of coils used for decoupling or the possibly non-linear field distribution generated by a gradient coil applied for multiple-quantum filtering. Also the actual volume of the sample may be taken into account inherently by restriction of the calculation to the volume detected during the field mapping procedure. This is particularly important for Shigemi or multi-compartment samples.

The simulation of the standard NMR experiment with a single nucleus yields a spectrum consisting of one spectral line that is essentially a convolution of the natural Lorentz line with the $B\mathbf{1}_k(r)$-weighted density-of-states (DOS), i.e. histogram, of the field map.

In an advantageous variant of the inventive method a spatial refinement of the measured map of the magnetic field distribution $B\mathbf{0}(r)$ is performed by means of interpolation of neighbouring data points of said map.

In a preferred variant of the inventive method the spectrum is calculated as a convolution of the density-of-states (DOS) of the magnetic field distribution $B\mathbf{0}(r)$ and the natural spectral lines of the "virtual" sample, where the natural widths of said "virtual" lines are selected according to the width of the lines in the real sample in order to smooth distortions in the DOS-histogram that are not of interest.

In a preferred variant of the inventive method the chosen natural width(s) are used as a criterion for selecting the parameters for spatial refinement, and/or DOS calculation, and/or spectrum calculation.

The quality criterion for the optimisation procedure (step (c)) is advantageously the smoothness of a spectral line, and/or the symmetry of a spectral line, and/or the splitting between neighbouring lines, and/or the height of an envelope Env(f) for spectral lines, and/or the full-width-at-half-maximum of the envelope Env(f) and/or the remaining difference between the envelope Env(f) and the simulated spectrum $I_S$(f).

The height and widths of a spectral line are well-established criteria. Further useful criteria are its smoothness (absence of extra, artificial peaks) and symmetry as mentioned above. Even more sophisticated approaches are required if the spectra are the result of more complicated virtual experimental setup. E.g. in the presence of neighbouring lines a measure for their splitting can also serve as a quality criterion. Furthermore, techniques like solvent suppression, multiple-quantum filtering, and decoupling favour an additional judgement of their efficiency. A further powerful means of deriving quality criteria from a single spectral line is the calculation of an envelope of the line. The envelope is a function of a preferred shape, e.g. a Lorentz function that fits closely to the spectrum while never running below it. From the envelope the height, the width, or the remaining difference to the original spectrum can be derived as quality criteria. The advantage of the envelope approach is the more global judgement of the spectrum as a whole while e.g. the width taken directly from the spectrum is only a very local measure.

In a highly preferred variant of the inventive method a weighted combination of multiple quality criteria is used. Depending on the optimisation algorithm to be used, multiple criteria can either be used directly in a method for multi-objective goal attainment, or they can enter a more simple constrained or unconstrained optimisation routine by combining (e.g. adding) them to form a single criterion. By weighting of the different criteria the optimum shape of the spectral lines can be influenced in the preferred way, leading to a compromise that accounts for all the important properties of the spectrum.

The envelope of a spectral line is preferably calculated by minimising a penalty function $$Diff(f) = Env(f) - I_S(f)$$

$$\mathrm{Pen}(f) = Diff(f)^2 \qquad \forall \quad Diff(f) \geq 0$$

$$\mathrm{Pen}(f) = (\mathrm{fine} \cdot |Diff(f)|)^{course} \qquad \forall \quad Diff(f) < 0$$

$$\mathrm{Penalty} = \sum_f \mathrm{Pen}(f)$$

with parameters "course" and "fine" for controlling the strictness of the envelope condition.

In a preferred variant the start values for the shim currents of the optimisation procedure (step (c)) are solutions of a least-squares (LSQ) algorithm, determined with or without a spatial weighting based on $B\mathbf{1}_k$(r). The start values for the shim currents determine the centre in the search space around which the optimisation should happen. The solution proposed by the LSQ algorithm is a reasonable choice.

The set of the shim functions and/or the search range used by the optimisation procedure are preferably selected based on the $$\mathrm{Efficiency}_i = \frac{\mathrm{Effect}_i}{\mathrm{Effort}_i}$$

of the shim function, that is of the magnetic field distribution of the shim coils per unit current $$S_i(r), \text{ with } \mathrm{Efficiency}_i = \frac{\mathrm{Effect}_i}{\mathrm{Effort}_i}$$

and $\mathrm{Effort}_i = C_i$ or $\mathrm{Effort}_i = \sqrt{P_i} = \sqrt{R_i C_i^2} = C_i\sqrt{R_i}$ or $\mathrm{Effort}_i = P_i$, where $B\mathbf{0}_{Start}$(r) is the field distribution according to the current start values and $R_i$ is the electrical resistance of the i-th shim coil.

It is advantageous, if the selected set of shim functions (magnetic field distribution of the shim coils per unit current Si(r)) is orthogonalised prior to performing the optimisation procedure. Therewith the condition of the optimisation problem and hence the convergence of the applied algorithm may be improved.

In a highly preferred variant of the inventive method an iterative gradient shimming is performed with a target field distribution $B\mathbf{0}_T$(r), which is different from zero, whereby the gradient shimming comprises an inner fit loop for error correction during step (d) and/or an outer optimisation loop comprising steps (a)-(d) for benefiting from improved homogeneity.

In principle, and in analogy to conventional gradient shimming, the whole shimming procedure could consist of a single NMR measurement and the determination and the application of the optimum shim setting. However, the iterative approach can help to actually realise the predicted optimum.

In contrast to the conventional method the optimisation procedure is not performed at each iteration. After the optimum solution was obtained, the associated residual field distribution $B\mathbf{0}_R$(r) is used as the target field $B\mathbf{0}_T$(r) aimed at in the following iterations. That means that during the first iteration the optimisation of the spectrum is performed and in the following iterations a fit algorithm is applied exclusively in the spatial domain, knowing that the target field will actually lead to the desired optimal line shape. For the fit a least-squares algorithm without any spatial weighting is very suitable. In this way the convergence of the iterative procedure is ensured because the target field can actually be achieved, which is usually not the case in the conventional gradient shimming method.

Once the iterations have converged to the target field, the whole procedure including optimisation and subsequent fitting may be repeated in order to benefit from an improved homogeneity.

The whole presented shimming procedure consists of two nested loops of measurement-calculation-blocks, the outer optimisation loop, and the inner fit loop. In addition the optimisation itself has a loop structure, however, without any measurements.

The convergence of the fitting iterations can be further improved by utilising the discrepancy between the expected calculated target field and the actually measured field after application of the new shi/m currents. Thus, e.g. differences between the assumed and the actually effective shim functions can be derived.

It is especially advantageous if a self-learning procedure during the fit iterations is used to correct for systematic errors to improve the convergence of the iterative procedure to the target field distribution $B0_T(r)$.

It is further advantageous that for improving the mapping of the magnetic field distribution B0(r) a position calibration and/or a correction of the mapped magnetic field distribution B0(r) are carried out in order to compensate for differences between the centres of the gradient and the shim coils, and/or for gradient non-linearity and/or for B0(r) field distortion. The shim maps acquired with a certain probe head can then be reused after changing the probe head position or exchanging the probe head itself.

In another variant of the inventive method theoretical instead of measured shim maps are used. Considerable time-savings and the availability of shim maps of unlimited range and avoidance of measurement errors can be achieved herewith.

A highly preferred variant of the inventive method comprises a continuously adaption of sequence parameters during the shimming iterations.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

DESCRIPTION OF PREFERRED EMBODIMENTS

Figure 1:
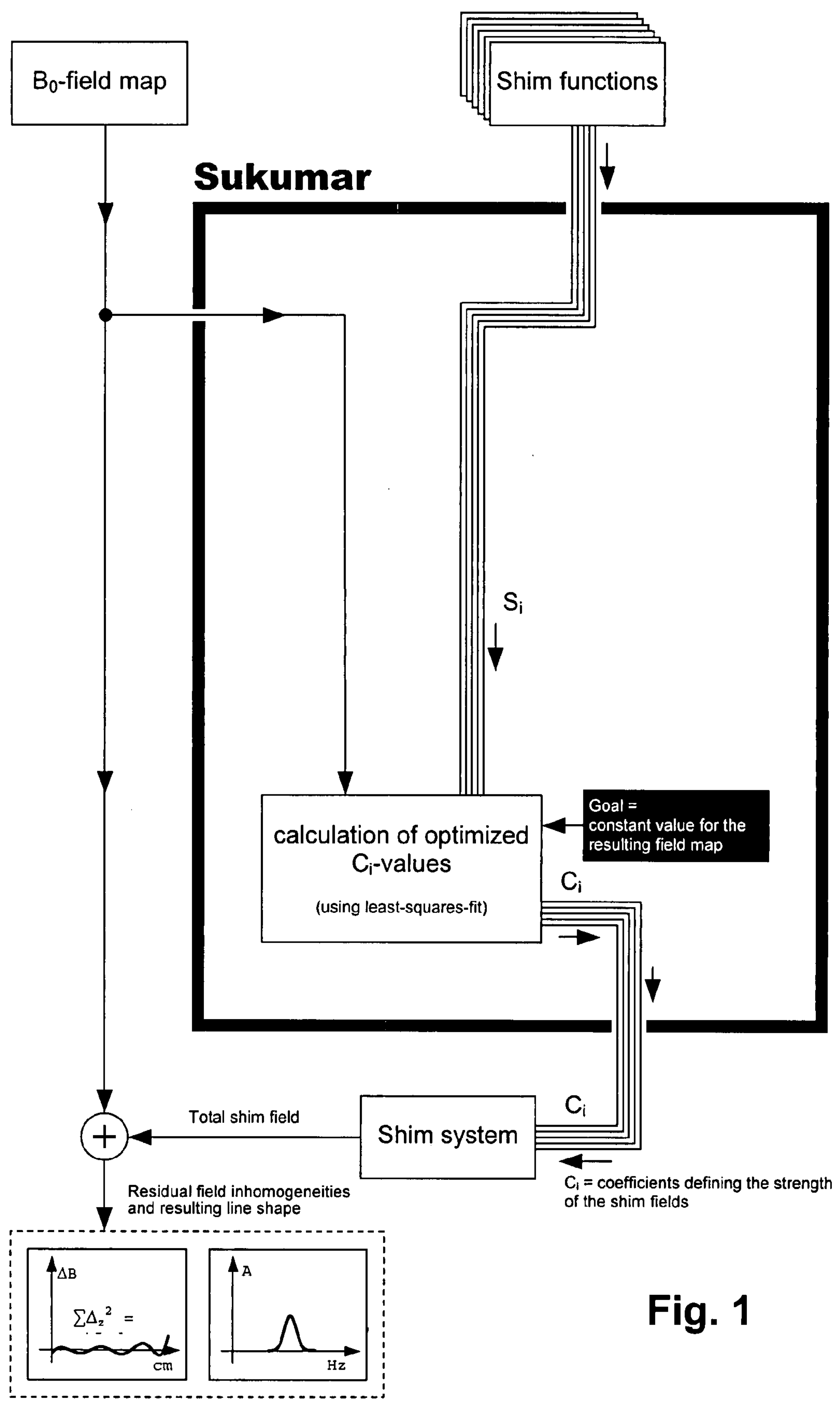
FIG. 1 shows a schematic drawing of a possible design of a NMR Spectrometer for executing the inventive method.

FIG. 1 shows the main building blocks of the NMR Spectrometer. The NMR Spectrometer comprises an experimental magnet area 1, a spectrometer area 2 with electronic components, and a computer 3 for controlling and evaluating the experiment. The experimental parameters such as gradient pulses and RF pulses and shim values as requested by the computer 3 are realised by gradient coils 4, RF coils 5 and shim coils 6 respectively within the magnet area 1 via the spectrometer area 2. The NMR signal received from a sample 7 is transferred to the computer 3, usually in a digitised form. In most cases, RF coils 5 and gradient coils 4 are part of a probe head, whereas the shim coils 6 are mounted in the magnet bore.

Figure 2:
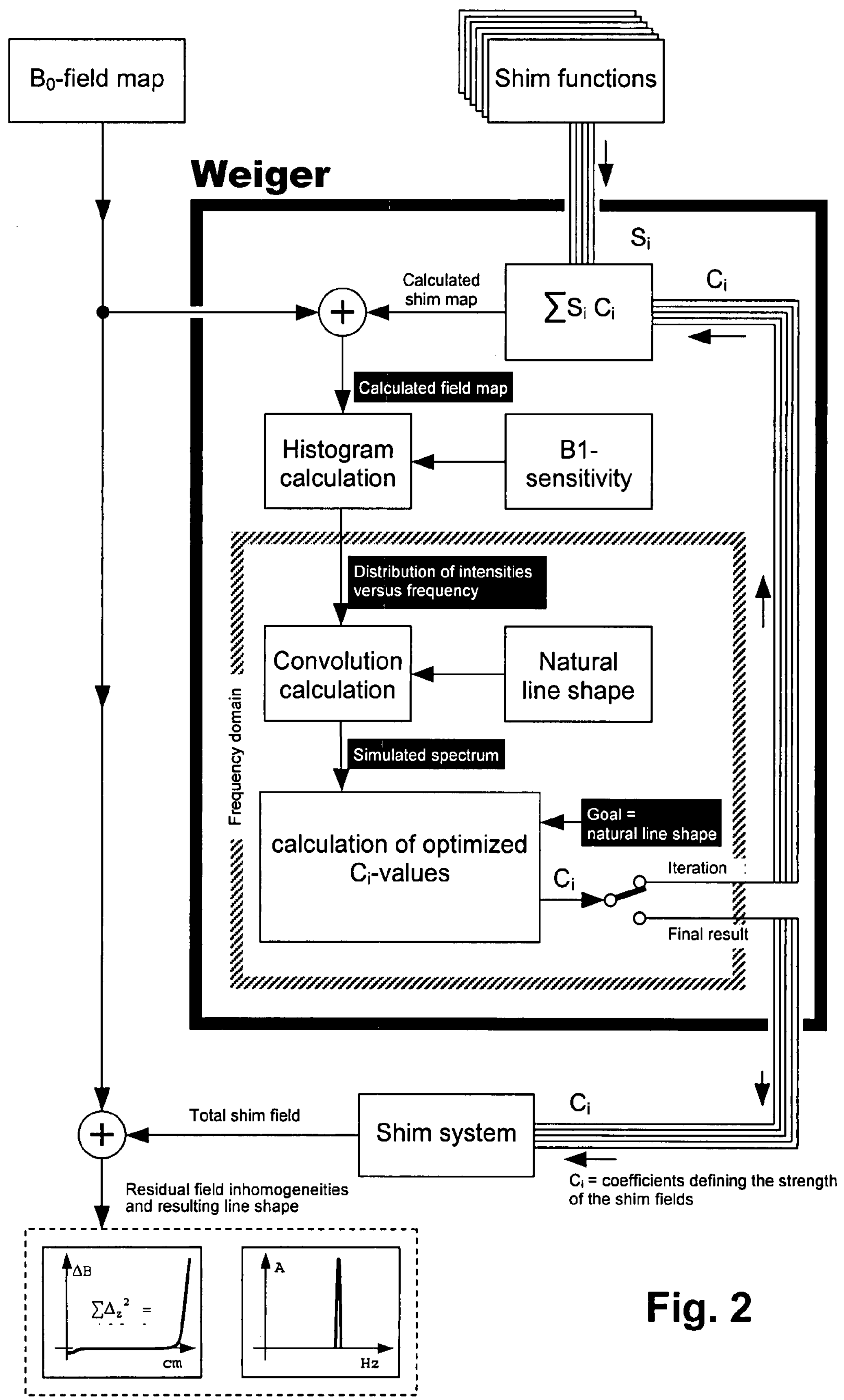
FIG. 2 shows a flow chart of an iterative approach used with conventional search and gradient shimming methods according to the state of the art.

FIG. 2 shows a flow chart of the iterative approach used with conventional search and gradient shimming methods. From the data obtained in an NMR measurement a criterion is calculated. If the result fulfils the requirements the procedure is stopped, otherwise new shim currents are calculated according to an algorithm. After setting the new shim values, the NMR data is updated etc. Each iteration consists of spectrometer operation (hatched box) as well as calculations (white box). With search methods the optimisation happens during the iterations. With gradient shimming the "optimum" choice of the shim values happens implicitly during a single run while iterating aims at benefiting from an increasingly improved homogeneity.

Figure 3:
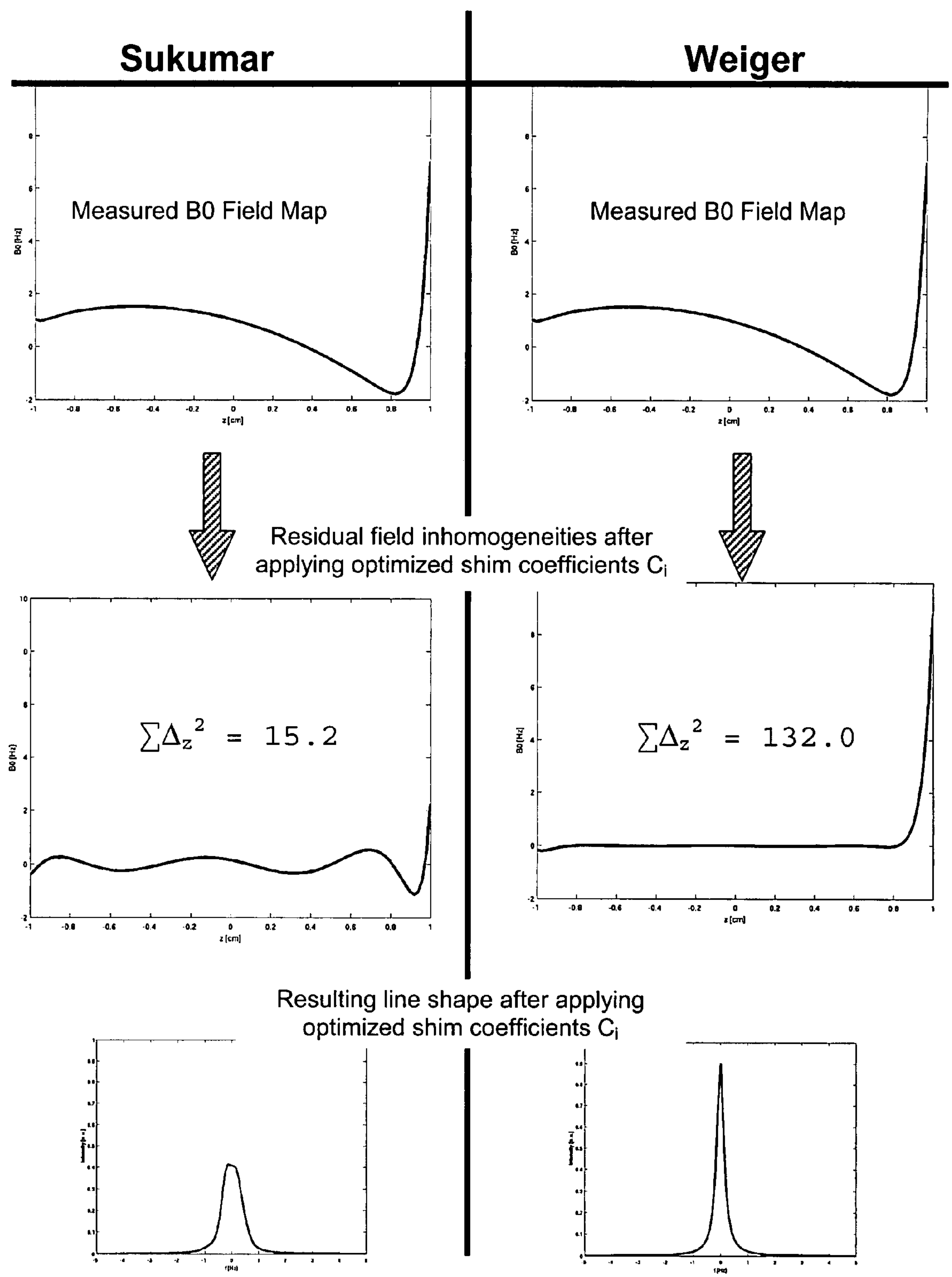
FIG. 3 shows a flow chart of the inventive procedure for optimising the simulated NMR line shape.

In FIG. 3 a flow chart of the procedure for optimising the simulated NMR line shape is shown. The structure is in complete analogy to conventional shimming with a parameter search. Only the parts of the "spectrometer operation" are replaced by simulation. From the input field maps B0 and B1 the simulated spectrum is calculated. The criterion derived from the spectrum enters the optimisation algorithm (elements marked with bold lines). After new shim values were determined, the application of them is simulated by adding the accordingly weighted shim functions to B0. The results associated with the found optimum are a set of shim values and the residual B0 used as a target field in the subsequent shimming procedure.

Figure 4:
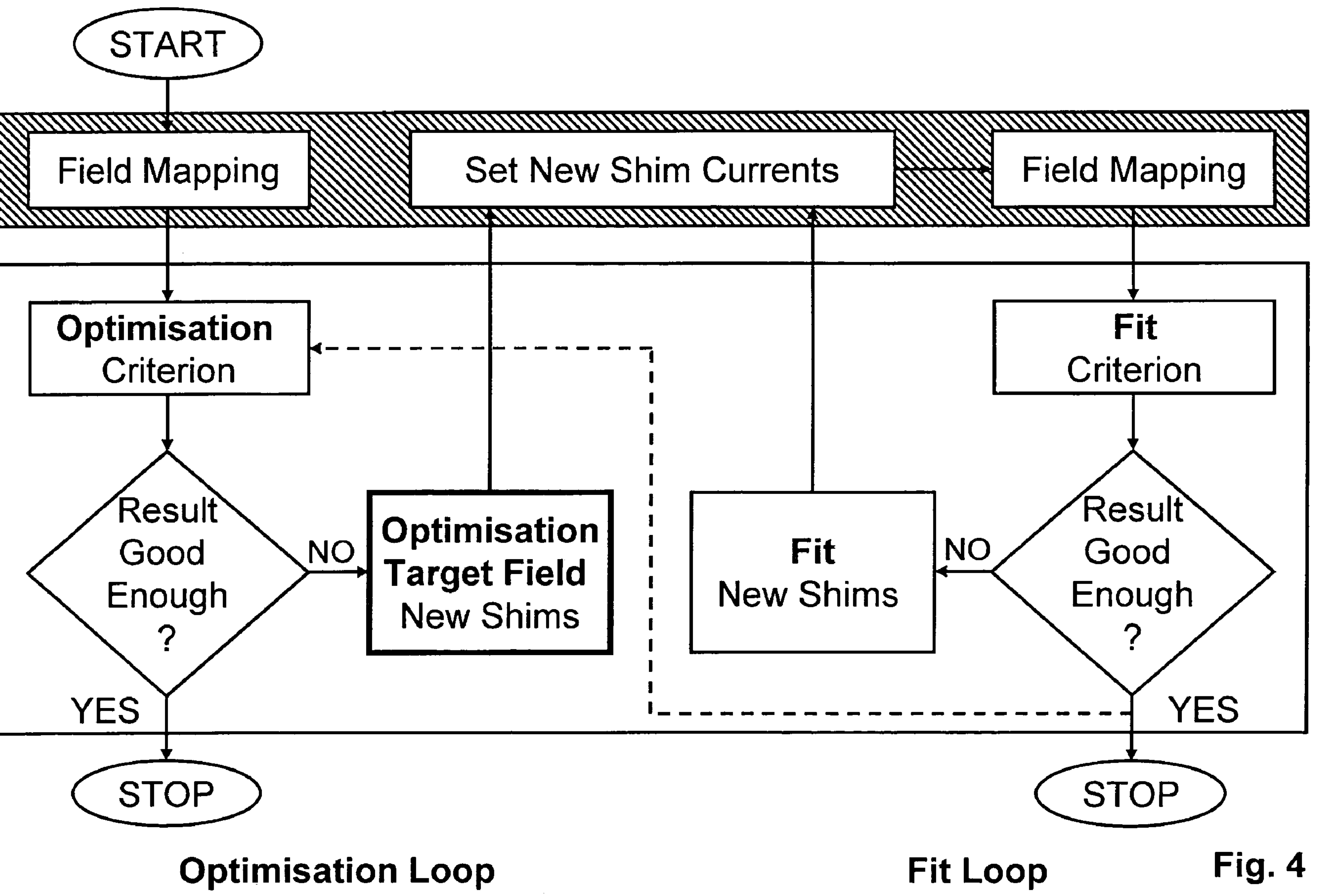
FIG. 4 shows a flow chart of the inventive iterative approach for gradient shimming with a target field.

FIG. 4 shows a flow chart of the iterative approach for gradient shimming with a target field. After mapping the field an absolute criterion is calculated and the procedure is stopped for a satisfying result. Otherwise the optimisation (bold frame, see FIG. 3) is performed with the desired criterion resulting in a target field distribution associated with the found optimum solution. After setting the new shim values the fitting iteration loop is entered. Field mapping is followed by comparison of the current with the target field by means of the fit criterion, e.g. the sum-of-least-squares. The fit procedure is iterated until the measured field is close enough to the target to ensure the fulfilment of the determined optimum solution. As an alternative to stopping at this stage the optimisation loop can be entered again (dashed line). This outer loop aims at benefiting from a potentially improved homogeneity as similar done with conventional gradient shimming (see FIG. 2). Differences between optimisation and fit loop are emphasised with bold letters. The enclosing boxes correspond to those in FIG. 2.

Simulated NMR Spectrum

Here, the calculation of a simulated spectrum is described for the simple excitation-acquisition NMR experiment. More complicated experiments require the simulation being adapted accordingly. The present approach consists of refinement of the measured data, calculation of the density-of-states (DOS), and convolution with the natural spectrum. In the following description it is assumed that the B0(r) map is given in frequency units of the nucleus of interest.

Spatial refinement means interpolation between neighbouring data points of the measured B0(r) map. It is necessary in order to prevent rapid field variations being reflected in the DOS as discontinuities. The smallest width Δf of a natural line used for the spectrum serves as a basis to determine the required degree of refinement. Furthermore, in order to save computation time the degree of refinement can be varied locally depending on the field gradient present in the B0(r)

map. With and without refinement each data point must be weighted according to the size of the represented volume element.

The DOS of the refined B0(r) map is calculated as a histogram of the B0 values present in the map. A reasonable bin size is chosen in dependence on Δf. When calculating the DOS the influence of the (normalised) B1 sensitivity must be taken into account by weighting a B0 data point at a location r with $$w(z)=\sin(B1(r)\cdot\alpha)\cdot B1(r)$$

with the first factor accounting for the excitation of maximum flip angle α and the second one for the signal reception.

The final spectrum is calculated as the convolution of the spectrum consisting of the lines of natural width with the DOS. The natural width should be selected such as to reflect the width of the expected lines in the real sample to be measured. In doing so the optimisation is not irritated by variations of the DOS not relevant for the result of interest. The grid size of the frequency axis is again chosen based on Δf.

Quality Criteria

Beside the commonly used criteria such as maximum height or full width at different heights of the spectrum, more sophisticated criteria are required to judge the shape of the line, for example smoothness, symmetry, or the envelope of a spectral line.

Smoothness

The aim is to penalise deviations of the spectral line from a smooth shape, e.g. extra peaks or bumps. Assuming a single spectral line I(f), the basic idea is to compare a line with a smoothed version of itself $I_{Smooth}(f)$. However, simple smoothing of the line would flatten also the main peak which is not desired. Therefore smoothing of a spectral line is performed in the following way:

1. The spectrum is separated into the two parts to the left and to the right of the maximum intensity value.
2. Each part is smoothed separately with a kernel of given maximum size (e.g. Δf). However, the kernel size is limited to twice the distance from the border that is the closer one to the frequency point to be smoothed. Thus for points very close to a border less smoothing is performed.
3. The two parts are merged again to form $I_{Smooth}(f)$.

The criterion is then calculated as follows $$Crit_{Smooth} = \frac{\sum_f |I(f) - I_{Smooth}(f)|}{\sum_f I(f)}$$

Symmetry

The symmetry criterion compares the two parts to the left and to the right of the maximum intensity of the spectral line, which is located at $f_{max}$.

$$Crit_{Symm} = \frac{\sum_F |I(f_{max}+f) - I(f_{max}-f)|}{\sum_f I(f)}$$

The sums run from f=0 up to $f=f_{border}$, where the latter is limited by that spectrum border that is closer to $f_{max}$.

Envelope

Useful envelope shapes for spectral lines are e.g. Lorentz, Gauss or Tsallis [5] curves, which have the advantage that they can be described in a closed mathematical form with the parameters position, width, and maximum height or integral. Only the Tsallis function has the additional parameter q that determines the transition between Lorentz and Gauss function. In contrast to that e.g. the Voigt curve cannot be described in such a simple manner, thus leading to a considerably larger computational effort.

The main property of the envelope of a spectrum is that it must fit closely to the spectrum while never running below it. In order to find the envelope Env(f) of a given shape fitting best to a spectrum I(f) the parameters are varied by means of an optimisation algorithm to minimise the difference between the two curves while for all available frequencies the intensity of the spectrum must not be larger than that of the envelope. To enable the use of a simple optimisation algorithm working on a smooth, continuous criterion for this task, the penalty function to be minimised is defined in the following way:

$$Diff(f) = Env(f) - I(f)$$

$$\text{Pen}(f) = Diff(f)^2 \qquad \forall \quad Diff(f) \geq 0$$

$$\text{Pen}(f) = (\text{fine}\cdot|Diff(f)|)^{course} \qquad \forall \quad Diff(f) < 0$$

$$\text{Penalty} = \sum_f \text{Pen}(f)$$

The parameters "course" and "fine" serve for adjusting the strictness of the envelope condition, where "course" controls the overall fit and "fine" may be used to accept or not to accept small deviations from the condition. Reasonable values are e.g. course=4 and fine=100.

Useful criteria derived from the envelope are e.g. the height, the full-width-at-half-maximum or the remaining difference between envelope and spectrum:

$$Crit_{Env} = \frac{\sum_f |Env(f) - I(f)|}{\sum_f I(f)}$$

Multiple Criteria

Multiple criteria $Crit_i$ can be combined in various ways, e.g. by simple weighted addition with weighting factors $weight_i$, to enable using them in an optimisation algorithm with a single criterion:

$$\text{Criterion} = \sum_i \text{weight}_i \cdot Crit_i$$

Optimisation Procedure

Important aspects of the optimisation procedure are the start values, the search range, the selection of a reasonable set of shim functions, and an the conditioning of the problem.

The start values for the shim currents, which determine the centre in the search space around which the optimisation should happen, are reasonably solutions proposed by the LSQ algorithm weighted with w(r). Multiple optimisations with start values based on different weightings could be performed and compared.

The search range used by the optimisation should reflect the available range of the current supply of the shim system. On the one hand, strict limitations to shim currents and power given by the shim system hardware can be taken into account by using an algorithm that constrains the search parameters. On the other hand, the order of magnitude of reasonable changes must be provided. Also, the relative range of the currents for the different shim functions is of particular importance. Therefore, a measure for the "effect per effort", or efficiency $$\text{Efficiency}_i = \frac{\text{Effect}_i}{\text{Effort}_i}$$

of a shim function is required, where both effect and effort can be chosen in different ways. The direct approach to the effect of a certain shim function is the change it can cause to the chosen criterion starting from the field distribution $B\mathbf{0}_{Start}(r)$ created with the start values.

$$\text{Effect}_i=\text{Criterion}(B0_{Start}(z)+C_iS_i(z))-\text{Criterion}(B0_{Start}(z))$$

Depending on the limitations of the shim current supply the current applied to or the power dissipated in the shim coil can serve as the effort.

$$\text{Effort}_i=C_i \text{ or } \text{Effort}_i=\sqrt{P_i}=\sqrt{R_iC_i^2}=C_i\sqrt{R_i} \text{ or } \text{Effort}_i=P_i$$

In this way the efficiency becomes a function of the current $C_i$ and a threshold for the efficiency can be used to determine the search range for each shim function. However, this approach requires calculation of the effect, i.e. the criterion, for several values of $C_i$ which can be avoided by making the effect linearly dependent on the current. As an approximation to the problem the starting B0 is assumed to be zero and the weighted LSQ sum is used as a criterion, thus the effect becomes $$\text{Effect}_i = C_i\sqrt{\frac{\sum_z w(z)\cdot(S_i(z)-\overline{S_i(z)})^2}{\sum_z w(z)}}.$$

In case of the current being used as the effort, the efficiency is then independent of $C_i$ and it can be used for setting the relative range of the different shim functions.

The efficiency can furthermore be utilised to automatically select the shim functions that are reasonable to apply in a situation determined by the current B0 inhomogeneity. To this end the efficiency of each shim is put into relation to the standard deviation of the current B0(r) weighted in the same manner, and a threshold is applied for the selection of the shims to be used. In the iterative procedure this leads to the order of the shimming being increased for successive iterations of the optimisation.

Finally, the condition of the optimisation problem and hence the convergence of the applied algorithm may be improved by orthogonalising the selected set of shim functions with or without weighting by w(z).

Disadvantages of Measured Shim Maps

An important part of the gradient shimming method is the determination of the shim maps, i.e. the spatial distribution of the fields generated by the shim coils. Conventionally this is performed with the same NMR mapping procedure as the B0 field map employing the gradient coil(s) mounted on the probe head. However, there are several disadvantages coming along with this approach:

1. Performing the mapping for all shim functions is a time-consuming procedure, in particular if three spatial dimensions are resolved.
2. Reusing shim maps for a different probe head is not trivial. This is due to potentially
   (i) different position and angular orientation of the gradient coil with respect to the shim system, and
   (ii) different spatial characteristics of the gradient fields leading to image distortions.
3. Reusing shim maps with the probe head they were acquired with after detaching and reattaching it may be hampered by changes in position or orientation.
4. Measured shim maps are prone to errors such as noise and phase wrapping. Furthermore, the obtained information is limited to the sample range and the sensitive range of the RF coil used for acquisition. Especially in the border regions with relatively low sensitivity large errors can occur. On the other hand, in these regions often very large B0 distortions are present making them particularly important for shimming.
5. A further image distortion error is introduced by the mere presence of B0 field inhomogeneity that superposes the imaging gradient. This effect is non-negligible when shim functions of high order are mapped with a relatively weak imaging gradient. In this case strong local field gradients shift the respective data points to a considerable degree.

In the following, methods are proposed to overcome the described limitations.

Calibrating Translational and Angular Position

As usually the B0 field map is acquired using the gradients mounted on the probe head, the centre of the map is identical with the gradient centres (defined by a zero field value). Moreover, the image axes are given by the orientation of the gradient axes. In order to enable reusing the shim maps acquired with a certain probe head their position and orientation must be given with respect to a coordinate system attached to the shim system.

A suitable set of shim functions can serve to define this coordinate system by mapping their 1D projections onto the gradient axes. This means that a certain current is applied to the respective shim coil and 1D mapping is performed with one of the probe head gradients. (As usual, a reference map without the shim function applied is also required.) Depending on the possible motional degrees of freedom and the number of spatial dimensions of the maps this approach leads to a couple of 1D mapping procedures that can be accomplished for each probe head in a relatively short time. The different sets of projections are then used to match the shim maps with the field map of the current probe head.

As an example, in the case of the single translational degree of freedom of a shift along Z a suitable shim function to use for position calibration is e.g. the quadratic function $Z^2$. The map of this function allows identifying the centre of the shim system in the Z dimension, i.e. the position of the extremum of the parabola.

Gradient Non-Linearity Correction

Due to various restrictions gradient coils built into probe heads do not provide a perfectly linear field in the sensitive range of the RF coil. Therefore maps acquired with such a gradient suffer from distortions leading to non-equidistant positions of the data points, in particular in the important border regions. In order to match the field data with the shim maps acquired with a different probe head equipped with a different gradient coil, the positions of both the field and the shim maps must be corrected using knowledge of the actual fields generated by the gradient coils. The latter can be obtained either by calculation from the coil geometry or by some kind of NMR or other field measurement.

B0 Field Distortion Correction

Distortions caused by the B0 inhomogeneity itself have the awkward property to be different for each shim and field map. Therefore, in principle the data grids for different maps never match. However, usually the introduced shift is far below the distance of the data points and hence negligible. Nevertheless, there may be situations where it plays a considerable role, e.g. for the mapping of high order shim functions or B0 fields with strong gradients at the ends of the RF coil. In these cases the pixel shifts can be corrected for in a first-order approach by taking into account the local gradient derived from the B0 map itself.

Using Theoretical Shim Maps

Finally, it is proposed to completely dispense with the mapping of the shim functions and use theoretical maps instead. The latter can e.g. be obtained by magnetostatic calculations using the geometrical and electrical properties of each shim coil. Furthermore, the influence of the surrounding (e.g. superconducting magnet coil and dewar) can be taken into account.

This approach requires application of the described methods for position calibration, gradient non-linearity correction, and possibly B0 field distortion correction to match the acquired field maps with the coordinate system of the given theoretical shim maps.

Slight differences between the theoretical and the actual field distribution are compensated in an iterative approach as described above The advantages of this approach are considerable time-savings and the availability of shim maps of unlimited range and free of measurement errors.

Adapting Parameters of the Field Mapping Sequence

The basis for a good results from gradient shimming obtained one way or the other are good NMR field map data. This requires the sequence parameters being chosen optimally. However, the optimal choice of some parameters depends on the B0 inhomogeneity to be mapped itself. Therefore, it is proposed to adapt certain parameters during an iterative gradient shimming procedure based on the latest field map information available. Thus the required data quality is achieved in the minimum measurement time. As a measure for the B0 inhomogeneity e.g. either its standard deviation can serve or the maximum field gradient observed in the map, depending on which parameter should be optimised.

In particular, the signal-to-noise-ratio (SNR) of the field map must be adapted to the variations of the map itself and to the order of the shim functions used. This can be accomplished amongst others by modification of the number of averages, the receiver bandwidth (associated with the strength of the imaging gradient), and the difference of the two echo times ΔTE.

However, all of these parameters have contradictory effects making their optimisation important. Increasing the SNR with more averages increases the measurement time. Increasing the SNR by reducing the bandwidth leads to an increased acquisition time and a lower gradient strength. The former causes signal loss due to dephasing and an increased measurement time while the latter gives more emphasis to distortion problems. The echo time difference again needs SNR optimisation in itself, as a large ΔTE gives larger phases differences for a certain field offset but also favours signal dephasing. Furthermore, unwrapping strong phase wraps may become too difficult.

Figure 5:
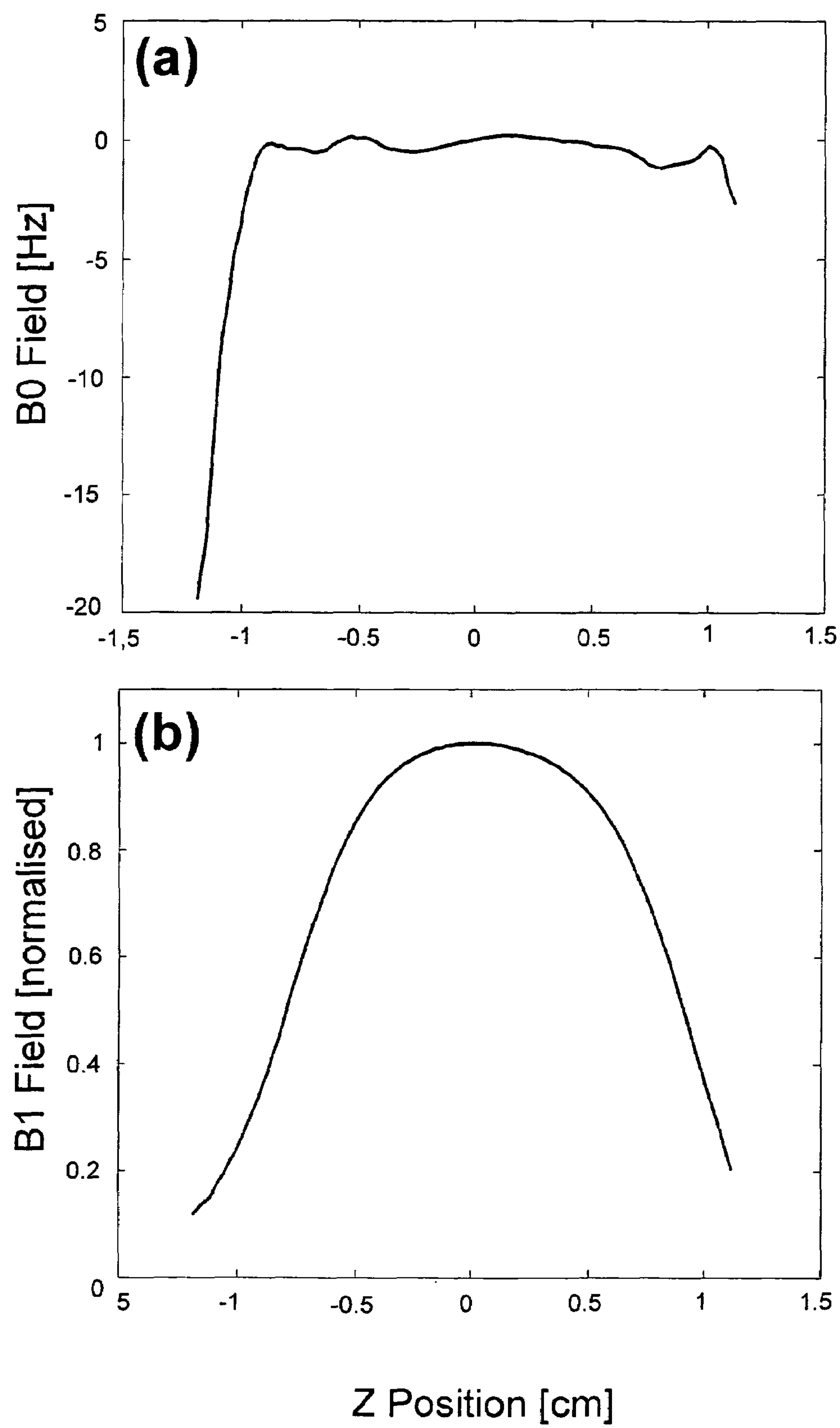
FIG. 5*a* shows a 1D map of the static magnetic field distribution B0.
FIG. 5*b* shows a 1D map the B1 sensitivity of the RF coil.

Simulations were performed based on NMR data acquired with a one-dimensional (1D) field mapping procedure. The B0 inhomogeneity and the B1 field of the coil were resolved along the direction Z of the main magnetic field. As a "virtual" sample free protons were used. In the NMR experiment a 90-degree excitation was followed by the acquisition. Six polynomial shim functions up to the fifth order were used, including a constant function. For the optimisation an unconstrained simplex algorithm was used. FIG. 5*a* shows an 1D map of the static magnetic field distribution B0 and FIG. 5*b* shows an 1D map of the B1 sensitivity of the RF coil. Both maps are the result of an NMR field mapping procedure acquired at 300 MHz. B0(z) was derived from the phase and B1(z) from the magnitude data, assuming that shimming and the NMR experiment are performed with the same coil. The Z dimension is along the direction of the B0 field as well as the sample axis. The B0 field is given in frequency units for protons.

Figure 6:
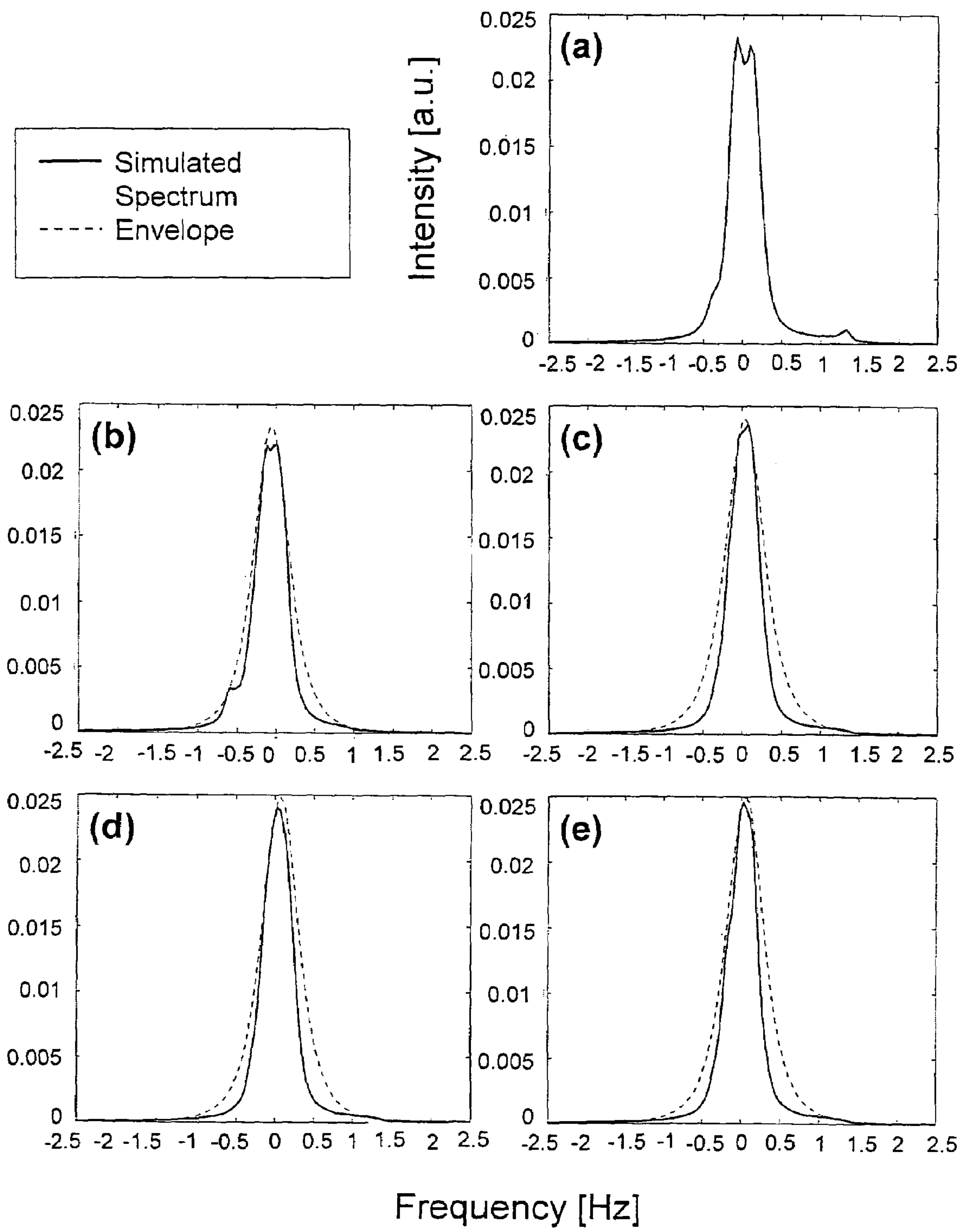
FIG. 6*a* shows a simulated spectrum obtained with a weighted least-squares (LSQ) algorithm.
FIG. 6*b-e* show simulated spectra obtained with shape optimisation.

Simulated Spectra are shown in FIG. 6*a-e*. The simulation was performed for a single proton line of Lorentzian shape with a width of 0.3 Hz using six polynomial shim functions up to the fifth order, including a constant function. The intensity of all spectra is given in arbitrary but equally scaled units. The spectrum shown in FIG. 6*a* has been obtained with a weighted least-squares (LSQ) algorithm. The LSQ line is relatively narrow but shows a splitting of the main peak, an extra peak at 1.3 Hz, and a slight bump on the left hand side of the line, which are unfavourable properties. Spectra obtained with shape optimisation with various criteria applied are shown in FIGS. 6*b-e*. All results show an improved shape without any compromise towards height or width. Optimisation of the line shape in FIG. 6*b* was performed by minimising the difference from an envelope with a Tsallis shape [5] with q=1.5. Without much change in width or height of the line the peak splitting is greatly reduced and the extra peak is removed, however, at the price of an increase of the bump. For obtaining the spectrum shown in FIG. 6*c* a criterion for quantifying the smoothness of the line was added to the difference criterion of used in FIG. 6*b*. As a result, the peak splitting as well as the bump is completely removed. In the spectrum of FIG. 6*d* a symmetry criterion was added to the spectrum of FIG. 6*c* resulting in a slightly more symmetrical shape. Finally, adding the width of the envelope as a further criterion in FIG. 6*e* leads to a slightly narrower line, however, at the price of some distortion of the shape.

Figure 7:
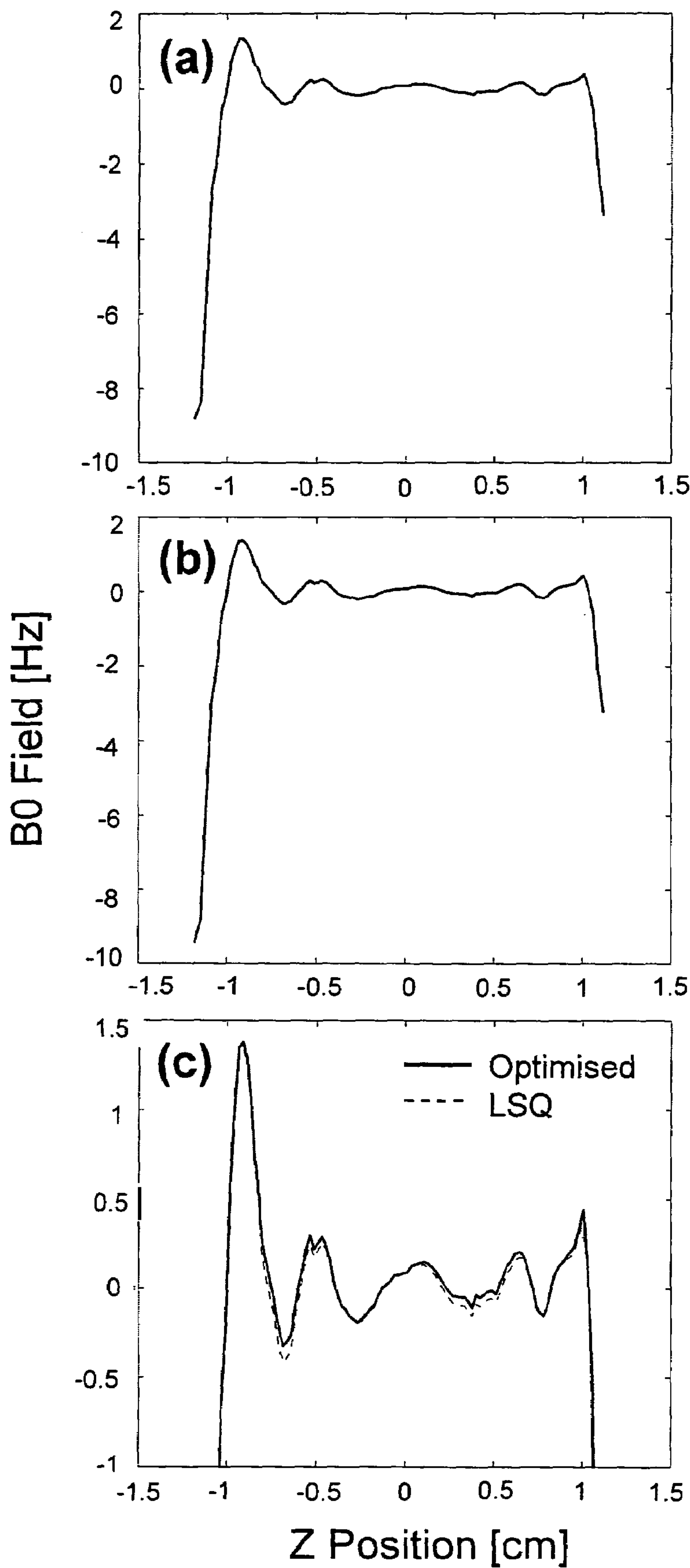
FIG. 7*a-c* show B0 fields associated with the simulated spectra of FIG. 6*a* and FIG. 6*d.*

A selection of B0 fields associated with the spectra is depicted in FIG. 7*a-c*. FIG. 7*a* shows the B0 field associated with the simulated spectrum of FIG. 6*a* which has been obtained with a weighted least-squares (LSQ) algorithm. In FIG. 7*b* the B0 field is shown which has been is associated with the spectrum of FIG. 6*d* and shows an optimised line shape with a criterion combined from envelope difference, smoothness, and symmetry. FIG. 7*c* shows the comparison of the spectra of FIG. 7*a* and FIG. 7*b* displayed with a zoomed B0 axis. It shows only little differences of the two results, however, leading to important differences in the spectra.

REFERENCES

[1] U.S. Pat. No. 5,218,299Dunkel R. Method for correcting spectral and imaging data and for using such corrected data in magnet shimming. (1993)

[2] Prammer M G, Haselgrove J C, Shinnar M, and Leigh J S. A new approach to automatic shimming. J Magn Reson 77 (1988) 40-52.

[3] Van Ziji P C M, Sukumar S, Johnson M, Webb P, Hurd R E. Optimized shimming for high-resolution NMR using three-dimensional image-based field mapping. J Magn Reson A111 (1994) 203-207.

[4] Sukumar S, Johnson M O, Hurd R E, Van Ziji P C M. Automated shimming for deuterated solvents using field profiling. J Magn Reson 125 (1997) 159-162.

[5] Howarth D F, Weil J A, Zimpel Z. Generalisation of the lineshape useful in magnetic resonance spectroscopy. J Magn Reson 161 (2003) 215-221.

List of Reference Signs and Abbreviations

1 magnet area
2 spectrometer area
3 computer
4 gradient coils
5 RF coils
6 shim coils
7 sample
B0 static magnetic field
B0(r) spatial distribution of the static magnetic field
$B0_R$(r) residual field distribution
$B0_T$(r) target field distribution
$B1_k$(r) spatial sensitivity distribution of the k-th radio-frequency (RF) coil
B1 RF field
$S_i$(r) magnetic field distribution of the shim coils per unit current (=shim function)
$C_i$ currents of shim coils
$C_i$ $S_i$(r) spatial field distribution of the shim coils
Env(f) Envelope
$I_S$(f) simulated spectrum
I(f) spectrum with one spectral line
$Crit_i$ criterion
$weight_i$ weighting factor
FID time domain signal
TE echo time

We claim:

1. A method for homogenising a static magnetic field with a magnetic field distribution B0(r) for nuclear magnetic resonance spectroscopy by adjusting the currents $C_i$ through the shim coils, thus creating spatial field distributions $C_i \cdot S_i$(r), where r stands for one, two, or three of the spatial dimensions x, y, and z, and said magnetic field distribution B0(r) has only a field component along z, in a working volume of a magnetic resonance apparatus with one or more radio frequency (=RF) coils (5) for inducing RF pulses and receiving RF signals within a working volume, said RF coils having a spatial sensitivity distribution of magnitudes $B1_k$(r), and with shim coils (6) for homogenising the magnetic field within the working volume, said shim coils (6) being characterised by their magnetic field distributions per unit current $S_i$(r) and having components only along z, the method including the following steps:

(a) Mapping the magnetic field distribution B0(r) of the main magnetic field, (b) calculating a simulated spectrum $I_s$(f) based on the sum of the magnetic field distribution B0(r) and the additional field distributions $C_i \cdot S_i$(r) generated by the shim coils (6), and on the sensitivity distributions $B1_k$(r) of the RF coils(5), (c) optimising a quality criterion derived from the simulated spectrum $I_s$(f) by using an optimisation procedure within a search range with the shim currents $C_i$ as a set of parameters, whereby for each new set of parameter values step (b) has to be repeated, the quality criteria being the smoothness of spectral line, and/or the symmetry of a spectral line, and/or the splitting between neighbouring lines, and/or the height of an envelope Env(f) for spectral lines, and/or the full-width-at-half-maximum of the envelope Env(f) and/or the remaining difference between the envelope Env(f) and the spectrum $I_s$(f), and (d) realising the found optimum of the quality criterion of step (c) by generating the associated target field distribution $B0_T$(r).

2. Method according to claim 1, characterised in that the mapping of the magnetic field distribution B0(r) in step (a) is carried out with phase sensitive NMR imaging using gradients.

3. Method according to claim 1, characterised in that a weighted combination of multiple quality criteria $Crit_i$ is used.

4. Method according to claim 1,, characterised in that the envelope of a spectral line is calculated by minimising a penalty function $$Diff(f) = Env(f) - I_S(f)$$

$$\text{Pen}(f) = Diff(f)^2 \qquad \forall \quad Diff(f) \geq 0$$

$$\text{Pen}(f) = (\text{fine} \cdot |Diff(f)|)^{course} \qquad \forall \quad Diff(f) < 0$$

$$\text{Penalty} = \sum_f \text{Pen}(f)$$

with parameters course and fine for controlling the strictness of the envelope condition.

5. Method according to claim 1, characterised in that the start values for the shim currents of the optimisation procedure (step (c)) are solutions of a least-squares (LSQ) algorithm, determined with or without a spatial weighting based on $B1_k$(r).

6. Method according to claim 1, characterised in that the set of the shim functions (=magnetic field distribution of the shim coils per unit current $S_i$(r)) and/or the search range used by the optimisation procedure are selected based on the $$\text{Efficiency}_i = \frac{\text{Effect}_i}{\text{Effort}_i}$$

of the shim function $S_i$(r), with $\text{Effect}_i = \text{Criterion}(B0_{Start}(r) + C_i S_i(r)) - \text{Criterion}(B0_{Start}(r))$ and $\text{Effort}_i = C_i$ or $\text{Effort}_i = \sqrt{P_i} = \sqrt{R_i C_i^2} = C_i \sqrt{R_i}$ or $\text{Effort}_i = P_i$, where $B0_{Start}$(r) is the field distribution according to the current start values and $R_i$ is the electrical resistance of the i-th shim coil.

7. Method according to claim 1, characterised in that the selected set of shim functions $S_i$(r) is orthogonalised prior to performing the optimisation procedure.

8. Method according to claim 1, characterised in tat an iterative gradient shimming is performed with a target field distribution B$\mathbf{0}_T$(r), which is different from zero, whereby the gradient shimming comprises an inner fit loop for error correction during step (d) of claim 1 and/or an outer optimisation loop comprising steps (a)-(d) of claim 1, for benefiting from improved homogeneity.

9. Method according to claim 8, characterised in that a self-learning procedure during the fit iterations is used to correct for systematic errors to improve the convergence of the iterative procedure to the target field distribution B$\mathbf{0}_T$(r).

10. Method according to claim 1, characterised in that for improving the mapping of the magnetic field distribution B0(r) a position calibration and/or a correction of the mapped magnetic field distribution B0(r) are carried out in order to compensate for differences between the centres of the gradient and the shim coils (6), and/or for gradient non-linearity and/or for B0(r) field distortion.

11. Method according to claim 1, characterised in that theoretical instead of measured shim maps are used.

12. Method according to claim 1, characterised in that sequence parameters are continuously adapted during the shimming iterations.

* * * * *